(12) United States Patent
Sato et al.

(10) Patent No.: US 7,050,285 B2
(45) Date of Patent: May 23, 2006

(54) SURGE PROTECTOR ASSEMBLY WITH GROUND-CONNECTOR STATUS INDICATOR CIRCUITRY

(75) Inventors: Nicholas Sato, Northbrook, IL (US); Slawomir Kielian, Mundelien, IL (US); Arif Oguz, Hoffman Estates, IL (US); Brian J. Truesdale, Plainfield, IL (US); James Fournier, Antioch, IL (US); Richard T. Halliday, Evanston, IL (US)

(73) Assignee: Illinois Tool Works Inc., Glenview, IL (US)

( * ) Notice: Subject to any disclaimer, the term of this patent is extended or adjusted under 35 U.S.C. 154(b) by 412 days.

(21) Appl. No.: 10/454,296

(22) Filed: Jun. 4, 2003

(65) Prior Publication Data

US 2004/0246644 A1    Dec. 9, 2004

(51) Int. Cl.
*H02H 1/00* (2006.01)
(52) U.S. Cl. ...................... 361/119; 361/118
(58) Field of Classification Search ............... 361/91.1, 361/111, 117, 118, 119, 120
See application file for complete search history.

(56) References Cited

U.S. PATENT DOCUMENTS

| 4,270,030 A | 5/1981 | Brolin et al. ......... 179/175.2 D |
| 4,529,847 A | 7/1985 | DeBalko ............... 179/175.3 F |
| 4,582,965 A | 4/1986 | Lembke ............... 179/175.3 R |
| 4,588,862 A | 5/1986 | Grabowy ................. 179/81 C |
| 4,686,697 A | 8/1987 | Shapiro ....................... 379/38 |
| 4,701,699 A | 10/1987 | Hoff ........................... 324/133 |
| 4,736,403 A | 4/1988 | McAlevey et al. ........... 379/26 |
| 4,741,016 A | 4/1988 | Callahan ...................... 379/21 |
| 5,210,937 A | 5/1993 | Delamoreaux ............... 29/839 |
| 5,272,594 A | 12/1993 | Delamoreaux ............. 361/736 |
| 5,483,409 A | 1/1996 | Heidorn et al. ............ 361/119 |
| 5,546,267 A * | 8/1996 | Frederiksen et al. ........ 361/119 |
| 5,907,606 A * | 5/1999 | Ingalsbe et al. ............ 379/146 |
| 6,031,706 A * | 2/2000 | Nabell ........................ 361/111 |
| 6,205,201 B1 * | 3/2001 | Prince ..................... 379/27.01 |
| 6,775,121 B1 * | 8/2004 | Chaudhry .................... 361/111 |

FOREIGN PATENT DOCUMENTS

CA    1074933    4/1980

* cited by examiner

*Primary Examiner*—Brian Sircus
*Assistant Examiner*—Danny Nguyen
(74) *Attorney, Agent, or Firm*—Mark W. Croll; Paul F. Donovan (57) ABSTRACT

There is provided a surge protector assembly for use with a 66-M type terminal connector block having a plurality of parallel rows of opposed terminals which are laterally spaced apart from each other. The surge protector assembly includes a housing module formed of co-mating front and back halves. A miniature printed circuit board is disposed within the housing module. Surge protector devices, a protector-operational status indicator circuitry, and a ground-connected status indicator circuitry are disposed on the miniature printed circuit board. A plurality of tip/ring terminal contacts are disposed within a lower portion of the housing module for mating with corresponding ones of the opposed terminals of the 66-M type terminal connector block.

23 Claims, 6 Drawing Sheets

SURGE PROTECTOR ASSEMBLY WITH GROUND-CONNECTOR STATUS INDICATOR CIRCUITRY

BACKGROUND OF THE INVENTION

1. Field of the Invention

This invention relates generally to surge protection devices for protecting telephone/data communications related equipment from power and transient surges. More particularly, it relates to an improved surge protector assembly for protecting telecommunications equipment from power and transient surges occurring on the tip and/or ring conductors of transmission lines connected thereto. Specifically, the surge protector assembly of the instant invention includes a two-piece interfitting housing module of a unique construction and a miniature printed circuit board for mounting surge protector devices, a protector-operational status indicator circuitry, and a ground-connected status indicator circuitry all disposed within the housing module.

2. Description of the Prior Art

As is generally known to those skilled in the telecommunications industry, modern telecommunication equipment is susceptible to transient surges such as those caused by lightning strikes and other voltage/current surges on the transmission lines. Thus, various arrangements of surge protector circuits are known in the prior art which have been provided for connecting to each pair of incoming telephone lines so as to protect the equipment from transient voltage and/or current surges. Each of the incoming telephone lines includes a "tip" line and a "ring" line.

In particular, there is known in the prior art of a 25-pair circuit protection assembly for protecting telecommunications related equipment having up to 25-pairs of wires from transient voltage and/or current surges which is described and illustrated in U.S. Pat. No. 5,483,409. The '409 patent was issued to R. H. Heidorn et al on Jan. 9, 1996 and assigned to the same assignee as that of the present invention which is hereby incorporated by reference in its entirety. As shown in FIGS. 1 through 7, the 25-pair circuit protection assembly includes a two-piece interfitting housing, a printed circuit board sub-assembly, an exposed side connector device, and a protected side connector device. The printed circuit board is mounted inside of the housing and is adapted to receive any number of circuit protector combinations of over-voltage, over-current and line-status devices therein. Schematic circuit diagrams of the various circuit protector devices are illustrated in FIGS. 7, 10, 11 and 16. While the circuit protector devices in FIGS. 10, 11 and 16 each include an indicator circuit which visually indicates the line status and/or blown fuse condition of the particular wire pair, none of these circuit protector devices includes a ground-connected status indicator circuitry for indicating visually whether the surge protector is properly connected to a ground potential.

The present invention represents an improvement over the above-discussed '409 patent in which none of the circuit protector devices provided a ground-connected status indicator circuitry. Therefore, an installer or user was unable to determine whether surge protector was properly connected to a ground connection or whether the ground connected to the surge protector was good or not. The inventors of the present invention have developed an improved surge protector assembly for protecting telecommunications related equipment from power and transient surges which includes a ground-connected status indicator circuitry for indicating visually whether the surge protector has been connected to a ground potential. The main purpose for the provision of the ground-connected status indicator circuitry is because almost all of the surge protectors are typically required to be connected to a ground potential in some fashion. This is due to the fact when a surge or transient occurs on the incoming telephone or data lines it will be diverted to ground in order to protect the equipment. If there is no good ground connection, then the surge protector will not function properly so that the surge will continue on to the equipment which is to be protected, thereby damaging and/or destroying the same.

In the present invention, the housing module has been designed to be mounted upon and for use in conjunction with an extensively used terminal block in the telephone communication industry, conventionally referred to as a "66-M type terminal connector block" that provides rapid wiring installation for key telephone Systems, PBX systems, cables, and other terminal equipment. Typically, these 66-M type terminal connector blocks are mounted on a standoff bracket and serve as an interface with user-provided equipment. A miniature printed circuit board is disposed inside the housing module and is designed to mount any number of surge protector network combinations of over-voltage and over-current protection, protection-operational status indicator circuitry, and ground-connected status indicator circuitry. The protection-operational status indicator circuitry provides a visual indication of the line status and/or blown fuse condition of a particular wire pair. The ground-connected status indicator circuitry provides a means of checking visually whether the surge protector has been properly connected to a ground potential. The housing module has also been designed to include openings formed in its top portion for receiving a protection-operational status indicator and a ground-connected status indicator. The housing module further includes a push-button switch mounted on its one side which is depressable to check for the ground connection.

SUMMARY OF THE INVENTION

Accordingly, it is a general object of the present invention to provide an improved surge protector assembly for use in conjunction with a 66-M type terminal connector block which is relatively simple and economical to manufacture and assemble.

It is an object of the present invention to provide a surge protector assembly having a two-piece interfitting housing module for receiving a miniature printed circuit board for mounting surge protector devices, a protection-operational status indicator circuitry and a ground-connected status indicator circuitry.

It is another object of the present invention to provide a surge protector assembly which includes a housing module having openings formed in its top portion for receiving a protection-operational status indicator and a ground-connected status indicator.

It is still another object of the present invention to provide a surge protector assembly which includes a housing module having a push-button switch mounted on its one side which is depressable to check for a ground connection.

It is yet still another object of the present invention to provide a surge protector assembly which is particularly useful for purposes of an easy plug-in connection into opposed terminals of a 66-M type terminal connector block for accommodating surge protector devices, a protector-operational status indicator circuitry, and a ground-connected status indicator circuitry.

In a preferred embodiment of the present invention, there is provided a surge protector assembly for use with a 66-M type terminal connector block having a plurality of parallel rows of opposed terminals which are laterally spaced apart from each other. The surge protector assembly includes a housing module formed of co-mating front and back halves. A miniature printed circuit board is disposed within the housing module. Surge protector devices, a protector-operational status indicator circuitry, and a ground-connected status indicator circuitry are disposed on the miniature printed circuit board. A plurality of tip/ring terminal contacts are disposed within a lower portion of the housing module for mating with corresponding ones of the opposed terminals of the 66-M type terminal connector block.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

Referring now in detail to the various views of the drawings and in particular to FIGS. 1 through 8, there is shown a plurality of surge protector assemblies constructed in accordance with the principles of the present invention which is designated generally by reference numeral 10. Each of the plurality of surge protector assemblies 10 is intended for physical and electrical association with a telephone terminal block 12, referred to as a "66-M type terminal connector block", which is commonly used within telecommunications related equipment and other electronic applications or systems. As can best be seen from FIG. 1, the 66-M type terminal connector block 12 comprises a plurality (four) of parallel rows 14a, 14b, 14c and 14d of terminals which are laterally spaced apart from each other.

Each of the respective rows 14a–14d is provided correspondingly with a plurality of longitudinally aligned terminals 16a–16d. The terminals 16a in the first row 14a are disposed in alignment laterally with the opposed terminals 16b in the second row 14b. Similarly, the terminals 16c in the third row 14c are disposed in alignment laterally with the opposed terminals 16d in the fourth row 14d. Thus, each set of the corresponding, laterally opposed or aligned terminals 16a, 16b and 16c, 16d define a terminal pair. Each of the plurality of surge protector assemblies 10 of the present invention suitably interconnects with one of the terminal pairs up to 50-terminal pairs (opposed terminals 16a, 16b in the rows 14a, 14b and opposed terminals 16c, 16d in the rows 14c, 14d) so as to protect sensitive telecommunication equipment from over-voltage and/or over-current conditions on incoming voice and data lines. In addition, each of the plurality of surge protector assemblies 10 provides a visual indication of line status and/or blown fuse condition of a corresponding terminal pair and a visual indication of whether the surge protector is properly connected to a ground potential. Further, each of the surge protector assemblies 10 can provide a variety of ground-connected status indicator circuitry options so as to check and determine whether the surge protector is properly connected to the ground potential.

Figure 2:
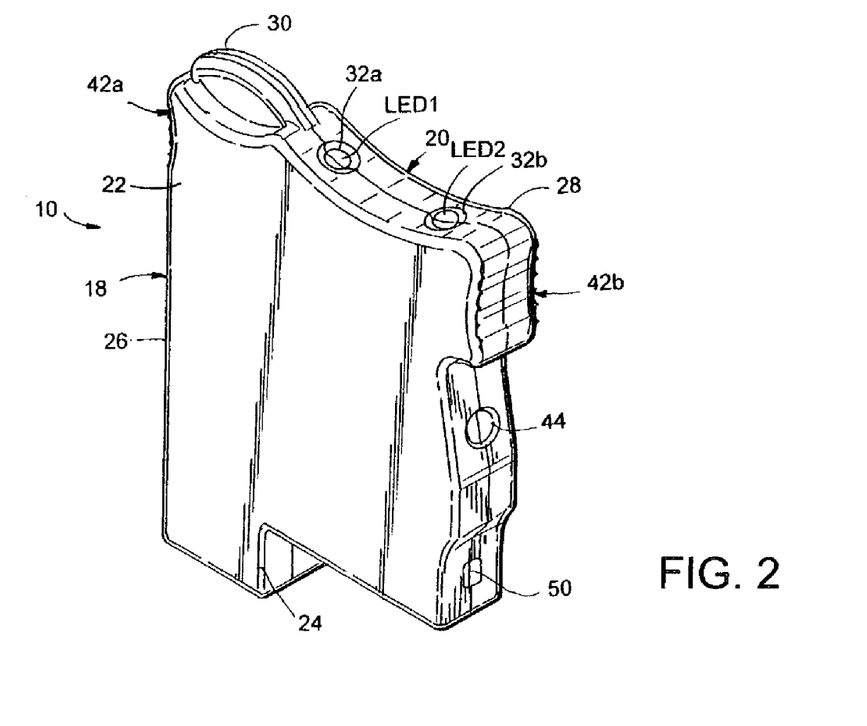
FIG. 2 is an enlarged, perspective view of one of the plurality of surge protector assemblies of FIG. 1.

One of the surge protector assemblies 10 is shown fully assembled in FIG. 2 and includes a housing module 18 which is made of a suitable material such as, for example, a fire-retardant polymer, and is comprised of two co-mating front and back halves 20, 22. The two halves 20 and 22 of the housing module are identical in their construction, which are assembled to each other and are ultimately secured together by suitable means such as sonic welding and the like. The housing module 18 includes a lower portion 24, a middle body portion 26, and an upper portion 28. The lower portion 24 is adapted to be plugged into the 66-M type terminal connector block 12 during use. The upper portion 28 includes an arch-shaped handle 30 facilitates gripping by a tool in order to easily remove the housing module from the connector block 18. The upper portion 28 also includes a pair of openings or recesses 32a, 32b for accommodating visual indicator devices. The opening 32a allows for receipt of a protection-operational status indicator LED1 for visually indicating the line status and/or blown fuse condition of a particular terminal pair. The opening 32b allows for receipt of a ground-connected status indicator LED2 for visually indicating whether the surge protector is properly connected to a ground potential.

The front and back halves 20 and 22 of the housing module 18 are provided with confronting and interfitting sidewall members 34 and 36, respectively, and are also provided with a recessed rear wall member 38. The sidewall members 34, 36 and the rear wall member 38 are all formed integrally together so as to effectively define a cavity for receiving and enclosing a miniature printed circuit board 40. The miniature printed circuit board 40 is used for mounting any number of different single or combined components in order to create various combinations of surge protector products having surge protector devices, protector-operational status indicator circuitry, and ground-connected status indicator circuitry all using the same standardized housing module 18.

Figure 1:
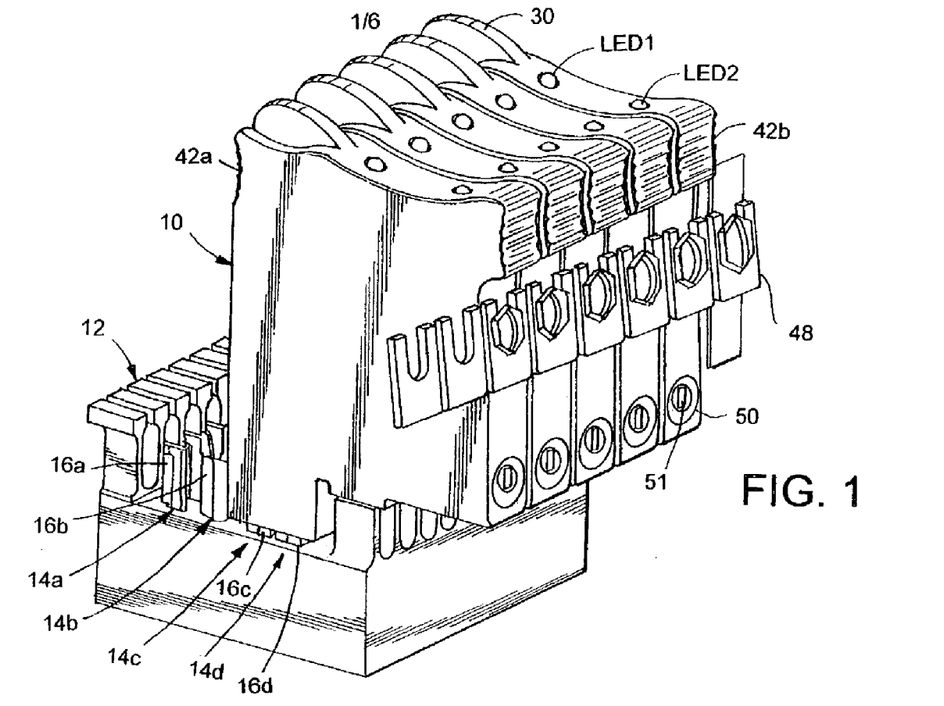
FIG. 1 is a perspective view of a plurality of surge protector assemblies, constructed in accordance with the principles of the present invention, for use in conjunction with a conventional 66-M type terminal connector block.

The upper part of the sidewall members 34, 36 of the middle body portion 26 in the front and back halves 20, 22 are provided with corresponding concave portions 42a, 42b which are used to produce an ergonomic grip by a user's or technician's fingers during a handling or transportation mode for easy insertion into and removal of the housing module 18 with respect to the connector block 12. The intermediate area of the middle body portion 26 of the housing module is provided with a ground contact 43 having a round threaded opening 44 for receiving a screw 46 to mount a grounding bar 48 (FIG. 1). The lower part of the body portion 26 includes an aperture 50 through which extends an actuator portion 51 of a push-button switch for activating the ground-connected status indicator circuitry. The lower portion in the front and back halves 20, 22 is provided with tip/ring terminal contacts 52 which are used for mounting the surge protector assembly 10 into engagement with the opposed terminals in the parallel rows of terminals 16a–16d in the connector block 12.

Figure 8:
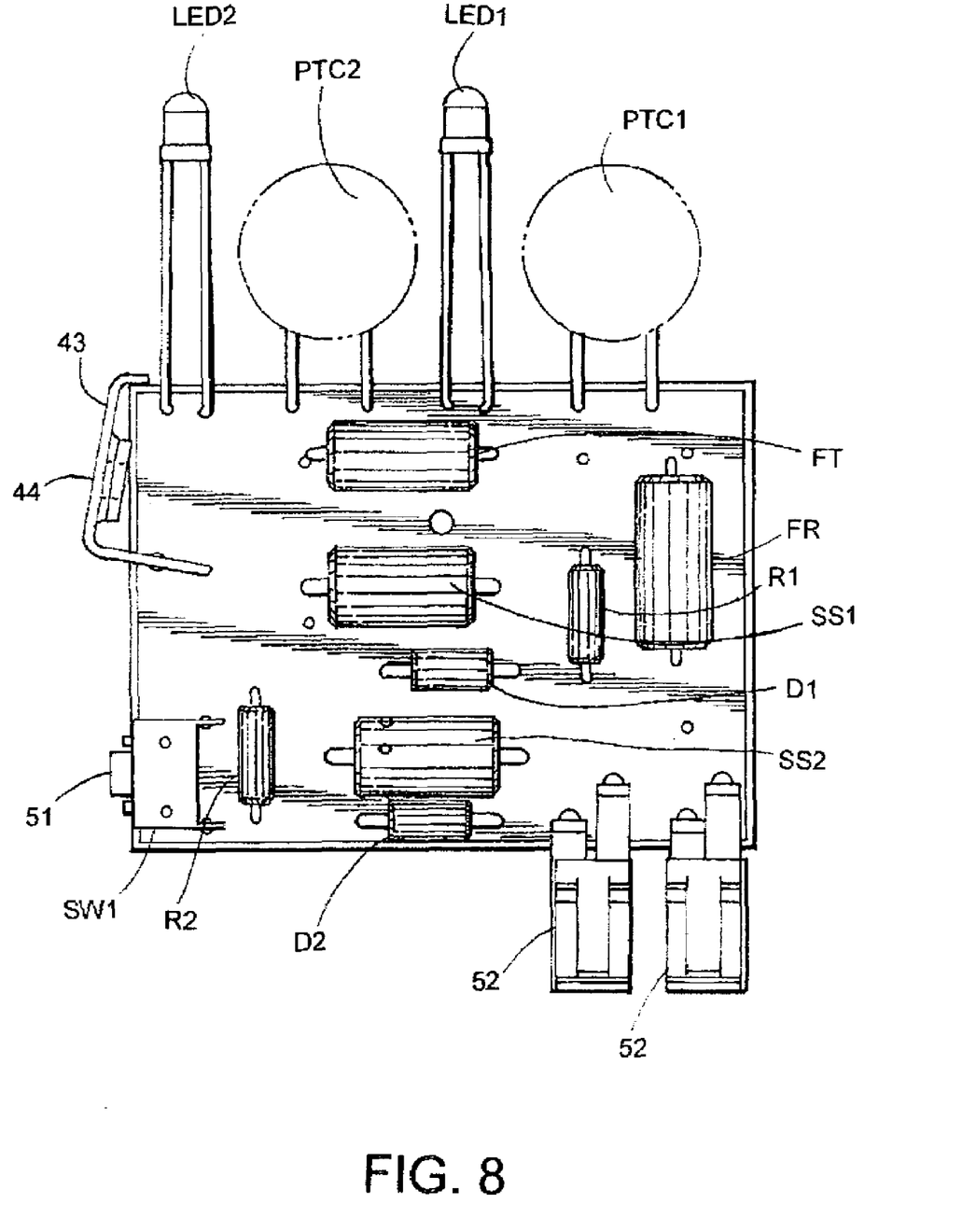
FIG. 8 is an enlarged view of the miniature printed circuit board of FIG. 7, showing the surge protector devices, the protector-operational status indicator circuitry, and the ground-connected status indicator circuitry mounted thereon.
Figure 9:
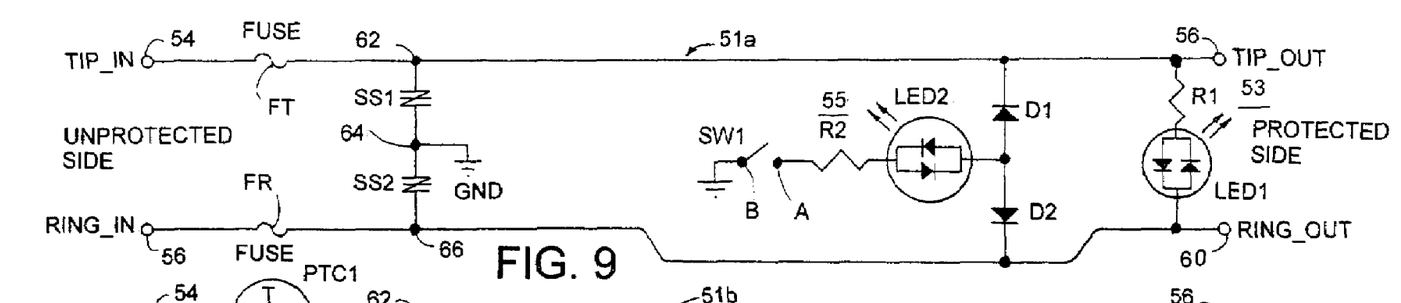
FIG. 9 is a schematic circuit diagram of the surge protector devices, the protector-operational status indicator circuitry, and the ground-connected status indicator circuitry of FIG. 8.

FIG. 8 is a plan view of the miniature printed circuit board 40 for mounting a surge protector network 51a consisting of a combination of surge protector devices, a protector-operational status indicator circuitry 53, and a ground-connected status indicator circuitry 55. A schematic circuit diagram of a preferred embodiment of the surge protector network 51a which includes a first combination of surge protector devices, the protector-operational status indicator circuitry 53, and the ground-connected status indicator circuitry 55 mounted on the miniature printed circuit board is illustrated in FIG. 9 of the drawings. As can be seen, the surge protector devices is comprised of a pair of sneak-current fuses FT and FR used to provide over-current protection and a pair of solid-state voltage suppressors SS1 and SS2 used to provide over-voltage protection. The fuse FT has its one end connected to an input tip terminal pin 54 and its other end thereof is coupled to an output tip terminal pin 56. Similarly, the fuse FR has its one end connected to an input ring terminal pin 58 and its other end is coupled to an output ring terminal pin 60. The first suppressor SS1 has its one end connected to the fuse FT at an internal node 62 and its other end thereof connected to one end of the second suppressor SS2 and to a ground potential GND at an internal node 64. The other end of the second suppressor SS2 is connected to the fuse FR at an internal node 66.

Two wires of incoming telephone/data lines are applied across the input tip and ring terminals 54,58 which define an unprotected side. Two wires of individual telephone equipment which are to be protected are applied across the output tip and ring terminals 56,60 defining a protected side. Each of the voltage suppressors SS1 and SS2 may be formed of a silicon avalanche suppressor (SAS), Sidactor, gas tube, or Zener diode. In this preferred embodiment, the voltage suppressors SS1, SS2 are similar to those commercially available from General Semiconductor under their part No. 1.5KE30CA. Also, the sneak-current fuses FT and FR may be alternately replaced with a pair of positive temperature coefficient (PTC) devices so as to provide resettable current limiting elements. The PTC devices are similar to those manufactured by Epcos under their part No. C1098-B100-A51.

The protector-operational status indicator circuitry 53 serves to provide a protection-operational status indicator which indicates visually the line status and/or blown fuse condition (i.e., whether the fuses FT and/or FR is open) of the particular wire pair. The indicator circuitry 53 is formed of a resistor R1 and a bi-directional light-emitting diode LED1. One end of the resistor R1 is connected to the output tip terminal pin 56 and its other end thereof is connected to one end of the diode LED1. The other end of the diode LED1 is connected to the output ring terminal pin 60.

As was previously pointed out, unlike the prior art the surge protector network 51a of the present invention includes the ground-connected status indicator circuitry 55 for indicating visually whether the surge protector devices (i.e., suppressors SS1, SS2) are properly connected to a ground potential or whether the ground connection is good or not. The ground-connected status indicator circuitry 55 is formed of a resistor R2, a bi-directional light-emitting diode LED2, a pair of rectifier diodes D1 and D2, and normally-open push-button switch SW1. One end of the resistor R2 is connected to contact A of the switch SW1 and its other end thereof is connected one end of the bi-directional diode LED2. The contact B of the switch SW1 is connected to a ground potential. The other end of the diode LED2 is connected to the common anodes of the rectifier diodes D1 and D2. The cathode of the diode D1 is connected to the output tip terminal pin 56, and the cathode of diode D2 is connected to the output terminal pin 60. However, it should be noted that the cathode of the diode D1 may be connected to the output ring terminal pin 60 and the cathode of the diode D2 may be connected to the output tip terminal pin 56 without affecting its operation. The bi-directional light-emitting diodes LED1 and LED2 may be similar to those commercially available from Kingbright under their part No. L937LGGD.

As was also previously mentioned, almost all of the surge protector devices for use in conjunction with the 66-M type terminal connector blocks are required to have a good connection in order to function properly. This is because when a transient or surge occurs on the telephone or data lines such surge is typically diverted to ground so as to protect the telephone equipment. Therefore, if the surge protector devices are not connected to ground they will malfunction and allow the surge to reach the telephone equipment which is to be protected, thereby damaging or destroying the same. The ground-connected status indicator circuitry 55 of the present invention permits an installer or user to easily and quickly check to determine if there is a good connection to ground.

In normal operation, the diode LED1 of the protection-operational status circuitry 53 will be lit. If either the fuse FT protecting the tip line is open or blown, the fuse FR protecting the ring line is open or blown, and/or one of the voltage suppressors SS1, SS2 is shorted to ground, then the diode LED1 will be extinguished to indicate visually that a failure has occurred. The diode LED2 of the ground-connected status indicator circuitry 55 will not normally be lit. In order to check for a good ground connection, the actuator of the switch SW1 is depressed momentarily and the diode LED2 will light if there is a proper ground connection. If there is not a good ground connection, then the diode LED2 will remain off when the actuator is depressed.

Figures 10, 11:
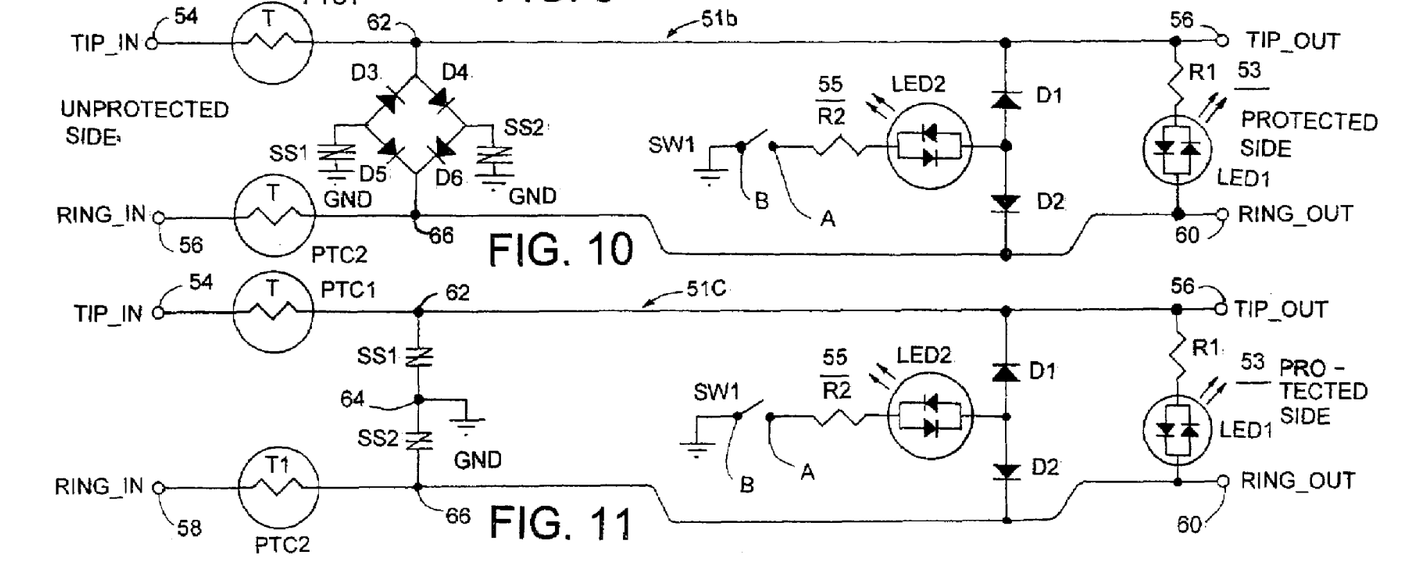
FIG. 10 is a schematic circuit diagram similar to FIG. 9, but with alternate surge protector devices.
FIG. 11 is a schematic circuit diagram similar to FIG. 9, but with second alternate surge protector devices.

In FIG. 10, there is depicted a schematic circuit diagram of a second embodiment of a surge protector network 51b which is substantially identical to the surge protector network 51a of FIG. 9 just described in detail above, except that the fuses FT, FR have been replaced with a pair of positive temperature coefficient devices PTC1 and PTC2 and a diode bridge rectifier formed of diodes D3–D6 has been added between the voltage suppressors SS1, SS2 and the internal nodes 62, 66 for use in applications where a high-speed, high-frequency of operation is required. Except for these differences, the remaining components or elements of the protection-operational status indicator circuitry 53 and the ground-connected status indicator circuitry 55 and their electrical interconnections are identical to FIG. 9.

In FIG. 11, there is depicted a schematic circuit diagram of a third embodiment of a surge protector network 51c which is also substantially identical to the surge protector network 51a of FIG. 9, except that the fuses FT, FR have been replaced with a pair of positive temperature coefficient devices PTC1 and PTC2. Except for this difference, the remaining components or elements of the protection-operational status indicator circuitry 53 and the ground-connected status indicator circuitry 55 and their electrical interconnections are identical to FIG. 9.

Figure 12:
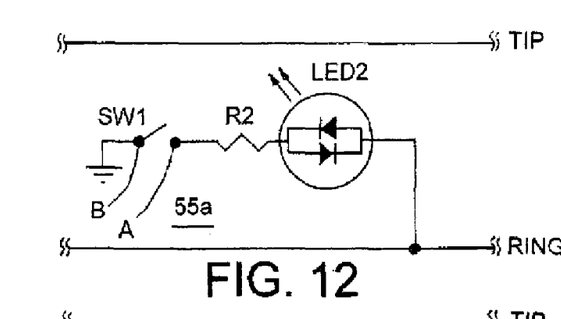
FIG. 12 is a schematic circuit diagram of an alternate ground-connected status indicator circuitry for use in FIGS. 9 through 11.
Figure 13:
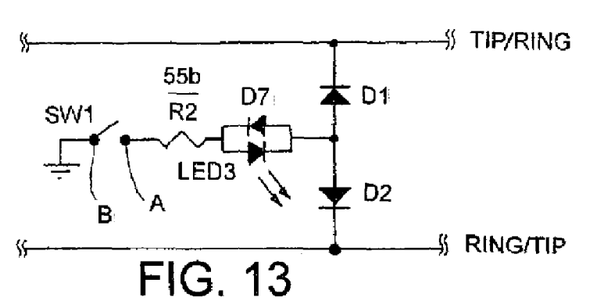
FIG. 13 is a schematic circuit diagram of a second alternate ground-connected status indicator circuitry for use in FIGS. 9 through 11.
Figure 14:
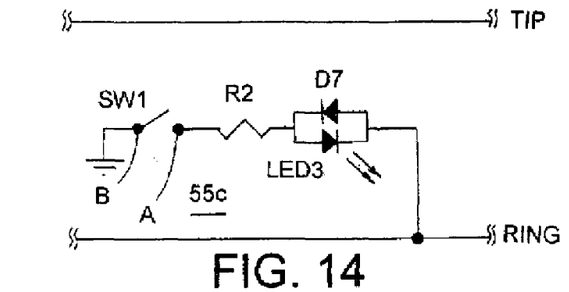
FIG. 14 is a schematic circuit diagram of a third alternate ground-connected status indicator circuitry for use in FIGS. 9 through 11.
Figure 15:
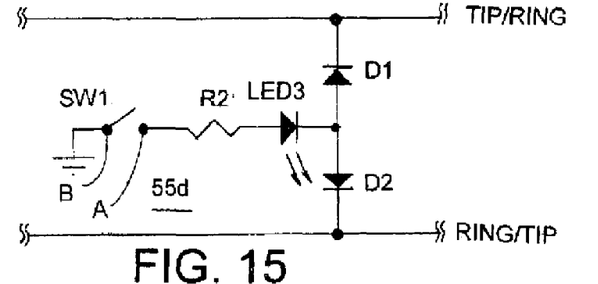
FIG. 15 is a schematic circuit diagram of a fourth alternate ground-connected status indicator circuitry for use in FIGS. 9 through 11.
Figure 16:
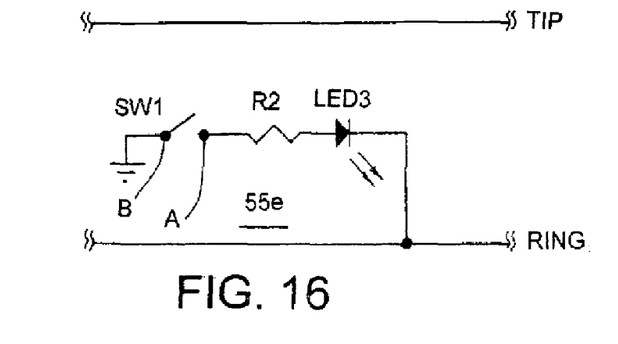
FIG. 16 is a schematic circuit diagram of a fifth alternate ground-connected status indicator circuitry for use in FIGS. 9 through 11.

FIG. 12 is a schematic circuit diagram of an alternate embodiment of the ground-connected status indicator circuitry 55a which is quite similar to the indicator circuitry 55 of FIG. 9, except that the rectifier diodes D1 and D2 have been eliminated. FIG. 13 is a schematic circuit diagram of a second alternate embodiment of the ground-connected status indicator circuitry 55b which is substantially identical to the indicator circuitry 55 of FIG. 9, except that the bi-directional light-emitting diode LED2 has been replaced with a single directional light-emitting diode LED3 and a reverse diode D7 is connected in parallel with the diode LED3 for protecting the same. Further, there is shown in FIG. 14 a schematic circuit diagram of a third alternate embodiment of the ground-connected status indicator circuitry 55c which is substantially identical to the indicator circuitry 55b of FIG. 13, except that the rectifier diodes D1 and D2 have been eliminated. In addition, there is depicted FIG. 15 a schematic circuit diagram of a fourth alternate embodiment of the ground-connected status indicator circuitry 55d which is substantially identical to the indicator circuitry 55b of FIG. 13, except that the reverse diode D7 has been eliminated. Finally, FIG. 16 is a schematic circuit diagram of a fifth alternate embodiment of the ground-connected status indicator circuitry 55e which is substantially identical to the indicator circuitry 55c of FIG. 14, except that the reverse diode D7 has been eliminated.

Figures 3, 6:
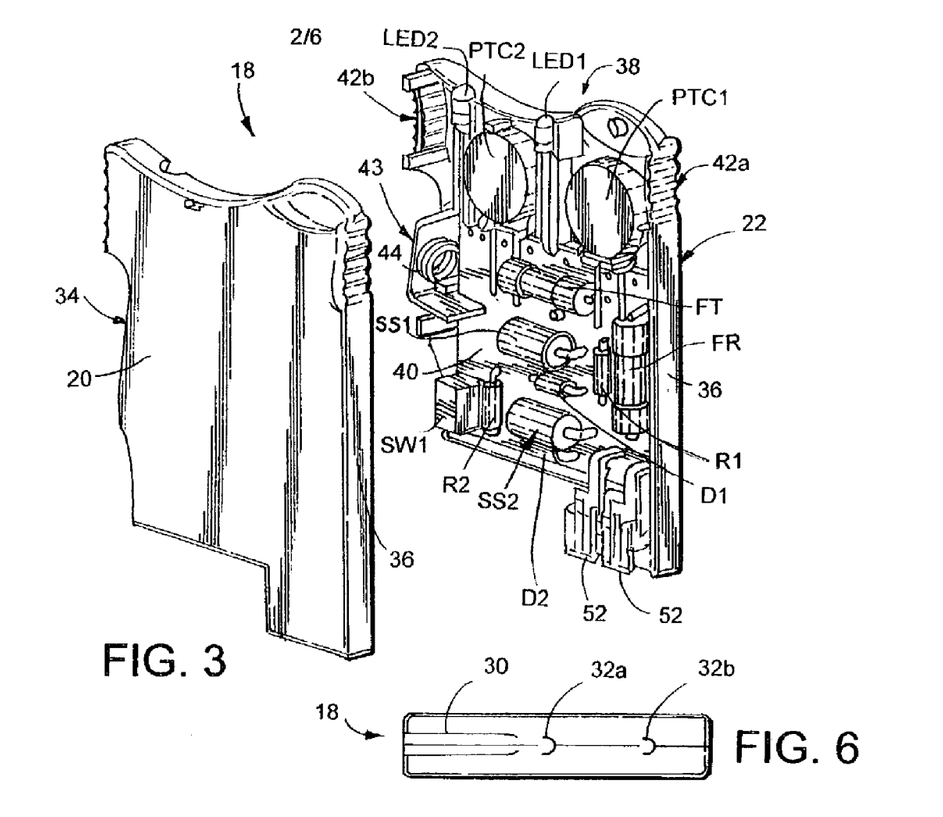
FIG. 3 is a view similar to FIG. 2 with the front housing half removed, illustrating the back housing half assembled with certain electrical components.
FIG. 6 is a top plan view of the surge protector assembly of FIG. 2.
Figure 4:
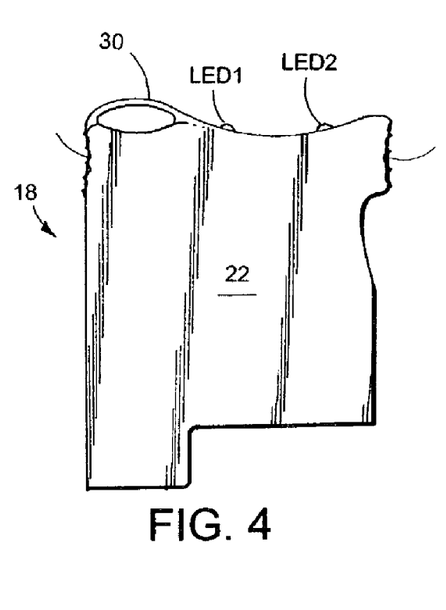
FIG. 4 is a side plan view of the surge protector assembly of FIG. 2.
Figure 5:
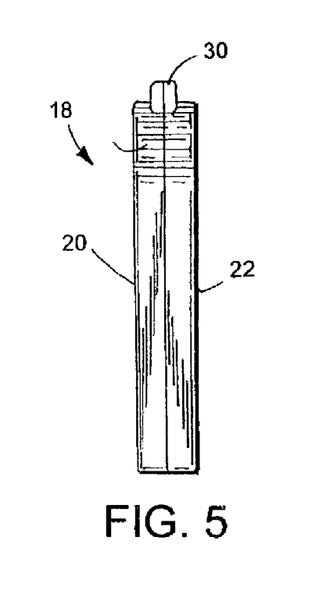
FIG. 5 is a left side elevational view of the surge protector assembly of FIG. 2.
Figure 7:
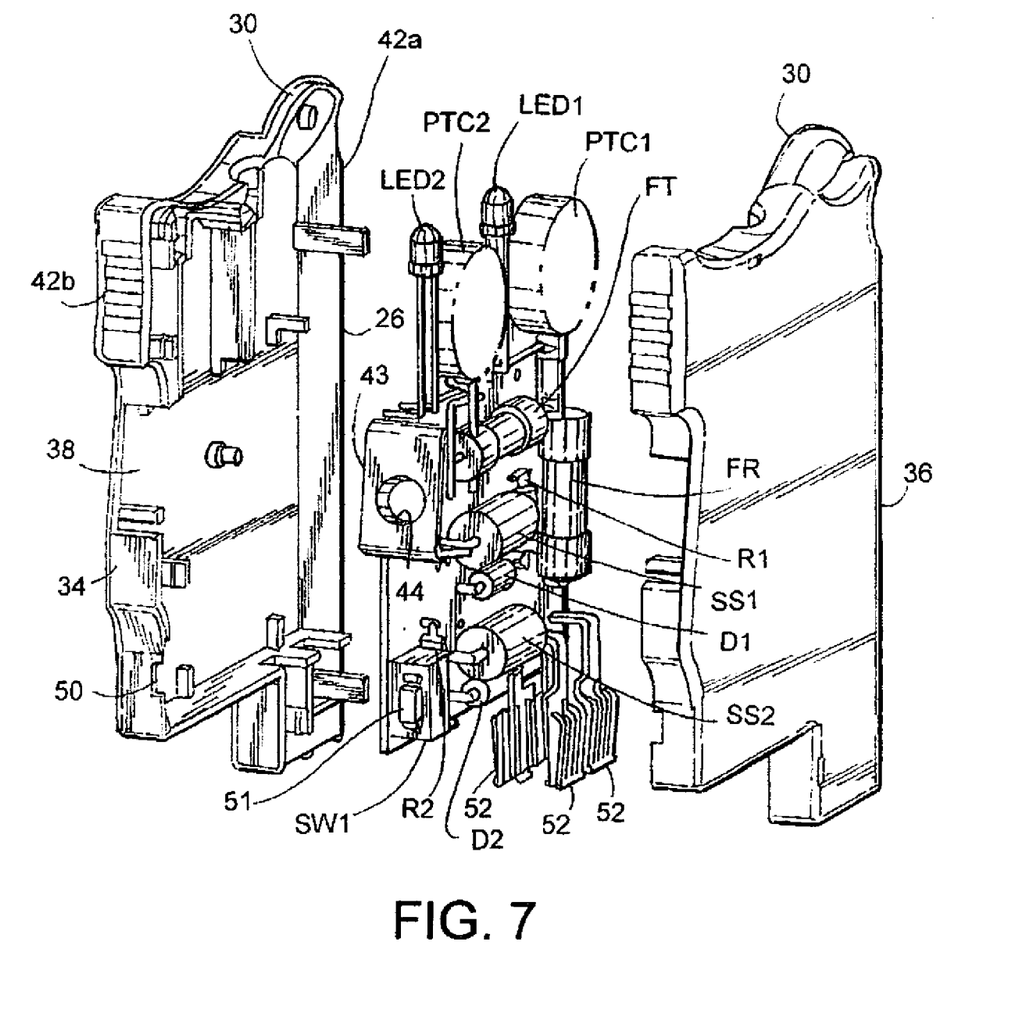
FIG. 7 is an exploded, perspective view of the surge protector assembly of FIG. 2.

In assembly, the tip/ring terminal contacts 52, ground contact 43, sneak-current fuses FT and FR, voltage suppressors SS1 and SS2, switch SW1, resistors R1 and R2, rectifier diodes D1 and D2, and bi-directional light-emitting diodes LED1 and LED2, are all positioned appropriately on the miniature printed circuit board 40. Next, all of the electrical components just mentioned are suitably soldered together so as to make the appropriate electrical connections as illustrated in the schematic circuit diagram of FIG. 9. The completed miniature printed circuit board with all of the components mounted thereon is shown in FIG. 8. This assembled printed circuit board 40 is then placed into the cavity of the back housing module halve 22 which is illustrated in FIG. 3. Next, the front halve 20 of the housing module is joined to the back halve 22 so as to sandwich the miniature printed circuit board 40 with its components therebetween. Thereafter, a sonic welding process or the like is used to fixedly secured the two housing module halves together so as to produce the surge protector assembly 10 as shown in FIG. 2. The terminal contacts 52 extend vertically through the lower portion of the housing module and are inserted or press fitted into the corresponding terminal pins 16a–16d so as to be mounted on the 66-M type terminal connector block 12. In this manner, the plurality of surge protector assemblies 10 of the present invention for use in conjunction with the terminal block is thus formed and is illustrated in FIG. 1.

From the foregoing detailed description, it can thus be seen that the present invention provides a surge protector assembly for use with a 66-M type terminal connector block having a plurality of parallel rows of opposed terminals which are laterally spaced apart from each other. The surge protector assembly includes a housing module formed of co-mating front and back halves. A miniature printed circuit board is disposed within the housing module. Surge protector devices, a protector-operational status indicator circuitry, and a ground-connected status indicator circuitry are disposed on the miniature printed circuit board. A plurality of tip/ring terminal contacts are disposed within a lower portion of the housing module for mating with corresponding ones of the opposed terminals of the 66-M type terminal connector block.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

The invention claimed is:

1. A surge protector assembly for use with a terminal connector block, comprising in combination:
   a terminal connector block having a plurality of parallel rows of opposed terminals which are laterally spaced apart from each other;
   housing module means formed of co-mating front and back halves;
   surge protector means, protector-operational status indicator means, and ground-connected status indicator means all disposed within said housing module means;
   a plurality of tip/ring terminal contacts disposed within a lower portion of said housing module means for mating with corresponding ones of opposed terminals of said terminal connector block; and
   said ground-connected status indicator circuitry means being used to check whether there is a proper ground connection for said surge protector means and being formed of a resistor, a bidirectional light-emitting diode, a pair of rectifier diodes, and a push-button switch.

2. A surge protector assembly as claimed in claim 1, wherein an upper portion of said housing module means includes an arch-shaped handle to facilitate gripping by a tool in order to easily remove said surge protector assembly from said connector block.

3. A surge protector assembly as claimed in claim 1, wherein a middle portion of said housing module means includes concave portions for providing an ergonomic grip by a user's fingers for easy insertion into and removal of the surge protector assembly from said connector block.

4. A surge protector assembly as claimed in claim 1, wherein said lower portion of said housing module means includes an aperture through which extends an actuator portion of a push-button switch for activating said ground-connected status indicator means.

5. A surge protector assembly as claimed in claim 1, wherein an upper portion of said housing module means includes a pair of recesses for receiving a first light-emitting diode for visually indicating the line status and/or blown fuse condition and a second light-emitting diode for visually indicating when said surge protector means is properly connected to a ground potential.

6. A surge protector assembly as claimed in claim 1, wherein said surge protector means comprises a pair of voltage suppressor means and a pair of sneak-current fuses so as to provide over-voltage and over-current protection for said terminal connector block.

7. A surge protector assembly as claimed in claim 1, wherein said surge protector means comprises a pair of voltage suppressor means and a pair of positive temperature coefficient devices so as to provide over-voltage and over-current protection for said terminal connector block.

8. A surge protector assembly as claimed in claim 1, wherein said surge protector means comprises rectifying means, a pair of voltage suppressor means, and a pair of positive temperature coefficient devices so as to provide over-voltage and over-current protection for said terminal connector block.

9. A surge protector assembly as claimed in claim 7, wherein said voltage suppressor means comprises a pair of silicon avalanche suppressors.

10. A surge protector assembly as claimed in claim 8, wherein said rectifying means comprises a diode bridge rectifier and said voltage suppressor means comprises a pair of silicon avalanche suppressors.

11. A surge protector network for protecting telecommunication equipment and the like from transient surges comprising:
    surge protector means including voltage protection means for providing over-voltage protection and current protection means for providing over-current protection;
    protector-operational status indicator means operatively connected to said current protection means for indicating visually of line status and/or blown fuse condition;
    ground-connected status indicator means operatively connected to said voltage protection means for checking whether there is a proper ground connection; and
    said ground-connected status indicator circuitry means being formed of a resistor, a bidirectional light-emitting diode, a pair of rectifier diodes, and a push-button switch.

12. A surge protector network as claimed in claim 11, wherein said voltage protection means comprises a pair of voltage suppressor means and said current protection means comprises a pair of sneak-current fuses.

13. A surge protector network as claimed in claim 11, wherein said voltage protection means comprises a pair of voltage suppressor means and said current protection means comprises a pair of positive temperature coefficient devices.

14. A surge protector network as claimed in claim 11, wherein said voltage protection means comprises rectifying means and a pair of voltage suppressor means and said current protection means comprises a pair of positive temperature coefficient devices.

15. A surge protector network as claimed in claim 13, wherein said voltage suppressor means comprises a pair of silicon avalanche suppressors.

16. A surge protector network as claimed in claim 14, wherein said rectifying means comprises a diode bridge rectifier and said voltage suppressor means comprises a pair of silicon avalanche suppressors.

17. A surge protector assembly as claimed in claim 11, wherein said protection-operational status indicator circuitry means is formed of a resistor and a bidirectional light-emitting diode.

18. A surge protector assembly for use with a terminal connector block, comprising in combination:
    a terminal connector block having a plurality of parallel rows of opposed terminals which are laterally spaced apart from each other;
    housing module means formed of co-mating front and back halves;
    surge protector means, protector-operational status indicator means, and ground-connected status indicator means all disposed within said housing module means;
    a plurality of tip/ring terminal contacts disposed within a lower portion of said housing module means for mating with corresponding ones of opposed terminals of said terminal connector block; and
    said ground-connected status indicator circuitry means being used to check whether there is a proper ground connection for said surge protector means and being formed of a resistor, a single directional light-emitting diode, a reverse diode connected in parallel with said single directional diode, a pair of rectifier diodes, and a push-button switch.

19. A surge protector assembly for use with a terminal connector block, comprising in combination:
    a terminal connector block having a plurality of parallel rows of opposed terminals which are laterally spaced apart from each other;
    housing module means formed of co-mating front and back halves;
    surge protector means, protector-operational status indicator means, and ground-connected status indicator means all disposed within said housing module means;
    a plurality of tip/ring terminal contacts disposed within a lower portion of said housing module means for mating with corresponding ones of opposed terminals of said terminal connector block; and
    said ground-connected status indicator circuitry means being used to check whether there is a proper ground connection for said surge protector means and being formed of a resistor, a single directional light-emitting diode, a reverse diode connected in parallel with said single directional diode, and a push-button switch.

20. A surge protector assembly for use with a terminal connector block, comprising in combination:
    a terminal connector block having a plurality of parallel rows of opposed terminals which are laterally spaced apart from each other;
    housing module means formed of co-mating front and back halves;

surge protector means, protector-operational status indicator means, and ground-connected status indicator means all disposed within said housing module means;

a plurality of tip/ring terminal contacts disposed within a lower portion of said housing module means for mating with corresponding ones of opposed terminals of said terminal connector block; and said ground-connected status indicator circuitry means being used to check whether there is a proper ground connection for said surge protector means and being formed of a resistor, a single directional light-emitting diode, a pair of rectifier diodes, and a push-button switch.

21. A surge protector network for protecting telecommunication equipment and the like from transient surges comprising:

surge protector means including voltage protection means for providing over-voltage protection and current protection means for providing over-current protection;

protector-operational status indicator means operatively connected to said current protection means for indicating visually of line status and/or blown fuse condition;

ground-connected status indicator means operatively connected to said voltage protection means for checking whether there is a proper ground connection; and said ground-connected status indicator circuitry means being formed of a resistor, a single directional light-emitting diode, a reverse diode connected in parallel with said single directional diode, a pair of rectifier diodes, and a push-button switch.

22. A surge protector network for protecting telecommunication equipment and the like from transient surges comprising:

surge protector means including voltage protection means for providing over-voltage protection and current protection means for providing over-current protection;

protector-operational status indicator means operatively connected to said current protection means for indicating visually of line status and/or blown fuse condition;

ground-connected status indicator means operatively connected to said voltage protection means for checking whether there is a proper ground connection; and said ground-connected status indicator circuitry means being formed of a resistor, a single directional light-emitting diode, a reverse diode connected in parallel with said single directional diode, and a push-button switch.

23. A surge protector network for protecting telecommunication equipment and the like from transient surges comprising:

surge protector means including voltage protection means for providing over-voltage protection and current protection means for providing over-current protection;

protector-operational status indicator means operatively connected to said current protection means for indicating visually of line status and/or blown fuse condition;

ground-connected status indicator means operatively connected to said voltage protection means for checking whether there is a proper ground connection; and said ground-connected status indicator circuitry means being formed of a resistor, a single directional light-emitting diode, a pair of rectifier diodes, and a push-button switch.

* * * * *